United States Patent
Inase et al.

(10) Patent No.: US 6,855,479 B2
(45) Date of Patent: Feb. 15, 2005

(54) PHASE-CHANGE OPTICAL RECORDING MEDIA

(75) Inventors: Toshio Inase, Kanagawa (JP); Hitoshi Iigusa, Kanagawa (JP)

(73) Assignee: Tosoh Corporation, Shinnanyo (JP)

(*) Notice: Subject to any disclaimer, the term of this patent is extended or adjusted under 35 U.S.C. 154(b) by 177 days.

(21) Appl. No.: 10/047,089

(22) Filed: Jan. 17, 2002

(65) Prior Publication Data

US 2002/0168495 A1 Nov. 14, 2002

(30) Foreign Application Priority Data

Jan. 17, 2001 (JP) .................................... P. 2001-009463
Jun. 12, 2001 (JP) .................................... P. 2001-177013

(51) Int. Cl.[7] ............................................. G11B 7/24
(52) U.S. Cl. ............... 430/270.13; 430/945; 369/275.5; 369/275.2; 428/64.5; 428/64.6
(58) Field of Search ........................ 430/270.13, 945; 369/275.5, 275.2; 428/64.5, 64.6

(56) References Cited

U.S. PATENT DOCUMENTS 5,124,232 A * 6/1992 Nakanishi et al. ..... 430/270.13
6,300,039 B1 * 10/2001 Ohbayashi et al. .... 430/270.13
6,352,753 B2 * 3/2002 Nonaka et al. ............ 428/64.1

FOREIGN PATENT DOCUMENTS

| EP | 731460 | * | 9/1996 |
| JP | 62-114134 | | 5/1987 |
| JP | 1-277342 | | 11/1989 |
| JP | 7-161072 | | 6/1995 |
| JP | 07-161072 | * | 6/1995 |
| JP | 2002-208182 | * | 7/2002 |

* cited by examiner

Primary Examiner—Martin Angebranndt
(74) Attorney, Agent, or Firm—Oblon, Spivak, McClelland, Maier & Neustadt, P.C.

(57) ABSTRACT

A phase-change optical recording medium which attains a high erasability in overwriting at a high linear velocity and has high recording sensitivity, excellent OW cycling characteristics, and excellent weatherability. The phase-change optical recording medium comprises a substrate and formed thereon a multilayered film comprising a protective layer and a recording layer and is that information is recorded/erased based on reversible phase changes in the recording layer between a crystalline phase and an amorphous phase, wherein the protective layer is a film made of an oxide of tantalum or aluminum and at least one carbide, and the content of the carbide is from 1 to 40 mol %.

12 Claims, 5 Drawing Sheets

21: Substrate
22: Protective layer
23: Recording layer
24: Protective layer
25: Reflective layer 31: Substrate
32: Protective layer
33: Recording layer
34: Protective layer
35: Reflective layer
36: Protective coating layer

FIG. 5

PHASE-CHANGE OPTICAL RECORDING MEDIA

FIELD OF THE INVENTION

The present invention relates to rewritable optical information recording media. More particularly, the invention relates to phase-change optical recording media in which information is recorded, reproduced, and erased based on phase changes in the recording layer which are caused by a laser beam or the like.

DESCRIPTION OF THE RELATED ART

Phase-change optical recording disks are a kind of rewritable optical recording disk, and information is recorded therein based on reversible phase changes (mostly between crystalline phase and amorphous phase) in the recording layer. In the phase-change optical recording disks, in general, light intensity modulation overwriting in the single recording layer is possible with a single head and signals are read out based on a change in reflectance accompanying a phase change. A feature of these recording media hence resides in that they are highly interchangeable with existing optical recording disks including CD-ROMs. Because of this, such recording disks are recently being investigated and developed enthusiastically as rewritable optical recording disks, and are used as rewritable DVDs.

In general, in phase-change optical recording media such as phase-change optical recording disks, recording is conducted by forming amorphous-phase recording marks in the crystalline phase (erased state) of the recording layer with a laser beam, and reproduced signals are obtained by detecting a difference in reflectance between the crystalline phase and the amorphous phase. Furthermore, light intensity modulation overwriting (direct overwriting) is made possible with a combination of a single beam and a single recording layer by modulating the intensity of the laser beam between an intensity for conversion to amorphousness (peak power) and an intensity for crystallization (bias power) during signal recording (see FIG. 1). Thus, a large capacity recording disk with high rate data transfer can be obtained.

Phase-change optical recording media are capable of direct overwriting (DOW) as described above. However, these recording media have a drawback that when a high linear velocity is used so as to realize a higher transfer rate, the initial signals are not completely erased through overwriting (OW) and unerased signals remain. Namely, an increase in linear velocity results in a worsened erasability.

SUMMARY OF THE INVENTION

An object of the invention is to provide phase-change optical recording media which are effective in attaining diminution in unerased signals and an improvement in the erasability in overwriting at a high linear velocity and have high recording sensitivity, satisfactory OW cycling durability, and satisfactory weatherability.

The present inventors made intensive investigations under the circumstances described above. As a result, they have found that in a phase-change optical recording medium which comprises a substrate and formed thereon a multilayered film comprising a protective layer and a recording layer and in which information is recorded/erased based on reversible phase changes in the recording layer between a crystalline phase and an amorphous phase, the erasability and durability in overwriting at a high linear velocity can be improved by forming the protective layer so as to comprise specific components. They have further found that this effect is enhanced by regulating the proportion of a component in the protective layer so as to be in a specific range. The invention has been completed based on these findings.

The invention provides a phase-change optical recording medium which comprises a substrate and formed thereon a multilayered film comprising a protective layer and a recording layer and in which information is recorded/erased based on reversible phase changes in the recording layer between a crystalline phase and an amorphous phase, wherein the protective layer comprises an oxide of tantalum and at least one carbide, the content of the carbide in the protective layer is from 1 to 40 mol %, and the protective layer is in contact with the recording layer.

The invention further provides a phase-change optical recording medium which comprises a substrate and formed thereon a multilayered film comprising a protective layer and a recording layer and in which information is recorded/erased based on reversible phase changes in the recording layer between a crystalline phase and an amorphous phase, wherein the protective layer comprises an oxide of aluminum and at least one carbide, the content of the carbide in the protective layer is from 1 to 40 mol %, and the protective layer is in contact with the recording layer.

The invention furthermore provides a phase-change optical recording medium which comprises a substrate and formed thereon a multilayered film comprising a protective layer and a recording layer and in which information is recorded/erased based on reversible phase changes in the recording layer between a crystalline phase and an amorphous phase, wherein the protective layer comprises an oxide of tantalum, at least one carbide, and one or more oxides of one or more elements selected from the group consisting of indium, silicon, titanium, hafnium and zirconium, the content of the carbide in the protective layer is from 1 to 40 mol %, and the protective layer is in contact with the recording layer.

The invention still further provides a phase-change optical recording medium which comprises a substrate and formed thereon a multilayered film comprising a protective layer and a recording layer and in which information is recorded/erased based on reversible phase changes in the recording layer between a crystalline phase and an amorphous phase, wherein the protective layer comprises an oxide of aluminum, at least one carbide, and one or more oxides of one or more elements selected from the group consisting of indium, silicon, titanium, hafnium and zirconium, the content of the carbide in the protective layer is from 1 to 40 mol %, and the protective layer is in contact with the recording layer.

The protective layer preferably contains one or more carbides selected from the group consisting of carbides of silicon, titanium, tantalum, and niobium. The recording layer in each of those phase-change optical recording media is preferably constituted of an alloy of germanium, antimony, and tellurium or a material containing the alloy as the main component.

Furthermore, the phase-change optical recording media of the invention are preferably used in such a high-transfer-rate region that the value of d/v, wherein d is the laser beam diameter (d=$\lambda$/NA, wherein $\lambda$ is the wavelength of the laser light and NA is the numerical aperture of the objective lens) and v is the linear velocity, is less than $1.5 \times 10^{-7}$ sec (d/v<$1.5 \times 10^{-7}$ [s]).

BRIEF DESCRIPTION OF THE DRAWINGS

FIG. 5 is a graphic presentation showing the linear-velocity dependence of the erasability of samples of Example 1 and the samples of Comparative Example 1.

Figure 1:
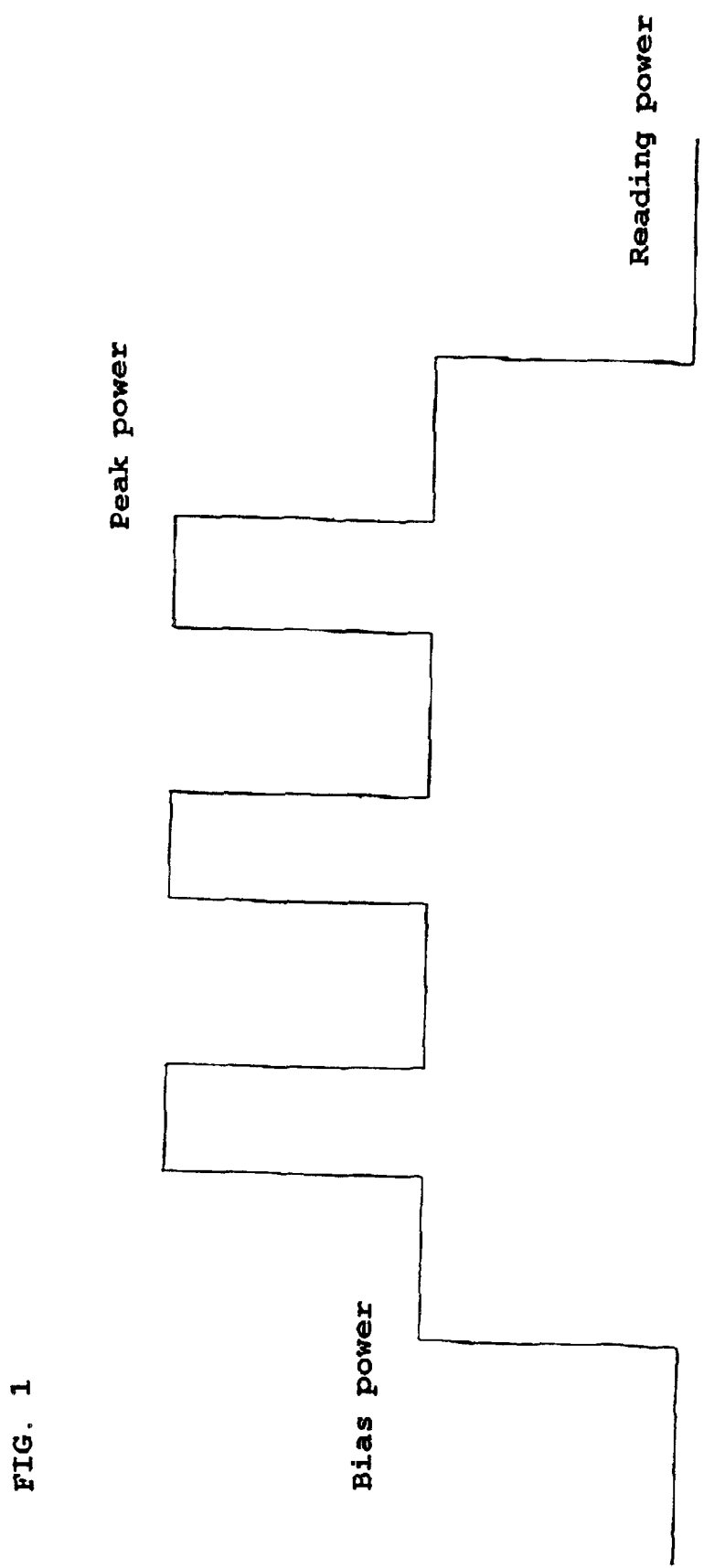
FIG. 1 is an illustration showing a laser power pattern for a recording/reproducing apparatus.

DESCRIPTION OF THE REFERENCE NUMERALS 21, 31: substrate
22, 32: first protective layer
23, 33: recording layer
24, 34: second protective layer
25, 35: reflective layer
36: protective coating layer

DETAILED DESCRIPTION OF THE INVENTION

The invention will be described in detail below.

Figure 2:
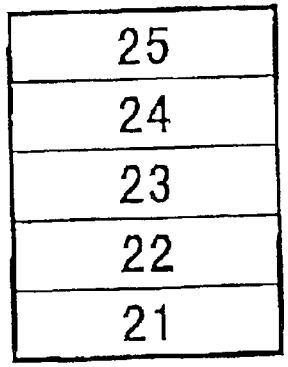
FIG. 2 is a sectional view showing the structure of part of one embodiment of the phase-change optical recording media of the invention.

FIG. 2 is a sectional view showing the structure of part of one embodiment of the phase-change optical recording media of the invention. The phase-change optical recording medium shown in FIG. 2 comprises a substrate 21 and, superposed thereon, a first protective layer 22, a recording layer 23, a second protective layer 24 and a reflective layer 25.

The substrate 21 is not particularly limited in material as long as it is sufficiently transparent in the wavelength region for the laser to be used and satisfies property requirements for medium substrates, such as mechanical properties. A glass, polycarbonate, amorphous polyolefin, or the like can be used as the material.

The first protective layer 22 and the second protective layer 24 each constituted of a film which comprises an oxide of either tantalum or aluminum and at least one carbide and in which the content of the carbide is from 1 to 40 mol %. Although even a protective layer consisting only of an oxide of either tantalum or aluminum can give a sufficiently high erasability, the high recording sensitivity can be obtained by the incorporation of a carbide while maintaining the high erasability to thereby attain excellent recording/reproducing/erasure characteristics at a high linear velocity. The protective layers preferably contain at least one carbide selected from carbides of silicon, titanium, tantalum, and niobium. The content of these carbides in the protective layers is generally from 1 to 40 mol %, preferably from 5 to 35 mol %, more preferably from 10 to 30 mol %, in terms of the total amount thereof. In case where the content of the carbides exceeds 50 mol %, the film may have an increased extinction coefficient (k) and impaired transparency and thus become impractical for use in phase-change optical recording media.

The first protective layer 22 and second protective layer 24 each may be a film which comprises an oxide of either tantalum or aluminum, at least one carbide, and one or more oxides of one or more elements selected from the group consisting of indium, silicon, titanium, hafnium, and zirconium and in which the content of the carbide is from 1 to 40 mol %.

The incorporation of one or more of oxides of indium, silicon, titanium, hafnium, and zirconium in the protective layers is effective in further enhancing the effect of improving recording sensitivity.

In the case of using a protective layer comprising an oxide of either tantalum or aluminum, at least one carbide, and one or more oxides of one or more elements selected from the group consisting of indium, silicon, titanium, hafnium, and zirconium, this protective layer also preferably contains one or more carbides selected from carbides of silicon, titanium, tantalum, and niobium. The content of these carbides in this protective layer is generally from 1 to 40 mol %, preferably go from 5 to 35 mol %, more preferably from 10 to 30 mol %, in terms of the total amount thereof. In case where the content of the carbides exceeds 50 mol %, the film may have an increased extinction coefficient (k) and impaired transparency and thus become impractical for use in phase-change optical recording media.

The recording layer 23 may be any of films which undergo reversible phase changes, such as a Ge—Sb—Te thin film and an In—Sb—Te thin film. It is, however, preferred to use an alloy of germanium, antimony, and tellurium or a material containing the alloy as the main component. The recording layer is formed so as to be in contact with at least one of the protective layers. The contact of the recording layer with the protective layer accelerates the formation of crystal nuclei at the contact plane (interface) to thereby enable crystallization to proceed more rapidly. Although a Ge—Sb—Te thin film, an In—Sb—Te thin film, or the like can be used as the recording layer, it is especially preferred to use a Ge—Sb—Te thin film as the recording layer of the phase-change optical recording media of the invention which have the protective layers described above, because crystallization in this recording layer is attributable mainly to nucleus formation.

The reflective layer 25 is constituted of a film having a high reflectance in the wavelength region for the laser to be used, such as a film of an aluminum alloy or silver alloy.

Besides functioning to protect the recording layer, the first and second protective layers function also to increase the efficiency of light absorption by the recording layer and to bring about an increased change in reflected-light amount through recording. Because of this, the first and second protective layers each are designed so as to have an optimal thickness while taking account of the wavelength of the laser light to be used, the thickness of the recording layer, etc.

In the invention, structures other than that described above can be used. For example, the structure described above may be modified so that a protective layer according to the invention is used as one of the first and second protective layers and a protective layer made of another material is used as the other protective layer.

The first and second protective layers, recording layer, and reflective layer can be formed by a vacuum deposition technique such as DC sputtering, RF sputtering or vacuum evaporation.

After these layers are formed, a protective coating layer made of a synthetic resin or another material may be formed thereon according to need.

The protective layer according to the invention is applicable also to the so-called surface reproduction type optical recording medium, which is produced by a process in which the sequence of film deposition is reversed.

The invention will be explained below in more detail by reference to the following Examples, but the invention should not be construed as being limited to these Examples only.

EXAMPLE 1 AND COMPARATIVE EXAMPLE 1

Figure 3:
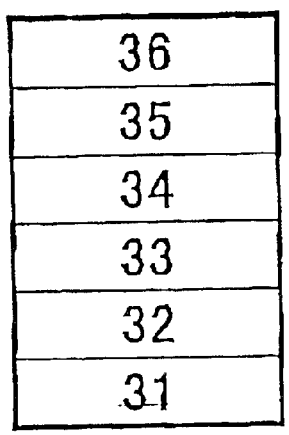
FIG. 3 is a sectional view showing the structure of part of each of the phase-change optical recording media obtained in Examples of the invention and in the Comparative Examples.

Phase-change optical recording media having the structure shown in FIG. 3 were produced in the following manner.

On a disk-form polycarbonate substrate 31 having a 0.7 μm-wide groove formed with a pitch of 1.4 μm was deposited a first protective layer 32 comprising $Ta_2O_5$ and SiC (film thickness: 100 nm) by simultaneous RF sputtering using a $Ta_2O_5$ target and an SiC target. Thereafter, a recording layer 33 comprising of $Ge_2Sb_2Te_5$ (film thickness: 20 nm) was deposited thereon by DC sputtering using a $Ge_2Sb_2Te_5$ alloy target. Furthermore, a second protective layer 34 comprising $Ta_2O_5$ and SiC (film thickness: 20 nm) was deposited thereon by simultaneous RF sputtering using a $Ta_2O_5$ target and an SiC target. Thereafter, an Al—Cr alloy (chromium content: 3 wt %) film (thickness: 150 nm) was formed as a reflective layer 35. An ultraviolet-curable resin was applied thereto to form a protective coating layer 36 having a thickness of 10 µm. Thus, a phase-change optical recording medium was completed.

In forming the protective layers in the structure described above, the proportion of the power applied to the $Ta_2O_5$ target to the power applied to the SiC target was varied. Thus, phase-change optical recording media were obtained in which the compositions of the protective layers were of six kinds which varied in SiC content from 1 to 40 mol % (Example 1, Samples 1 to 6). For the purpose of comparison, phase-change optical recording media having SiC contents in the protective layers of 0, 50, and 70 mol %, respectively, were also produced (Comparative Example 1, Samples 1 to 3).

EXAMPLE 2 AND COMPARATIVE EXAMPLE 2

The same procedure as in Example 1 was conducted, except that $Al_2O_3$ was used in place of the $Ta_2O_5$ as a component of the first protective layer and second protective layer. Thus, phase-change optical recording media were obtained in which the compositions of the protective layers were of six kinds which varied in SiC content from 1 to 40 mol % (Example 2, Samples 1 to 6). For the purpose of comparison, phase-change optical recording media having SiC contents in the protective layers of 0, 50, and 70 mol %, respectively, were also produced (Comparative Example 2, Samples 1 to 3).

EXAMPLE 3

Phase-change optical recording media were produced in the same manner as in Example 1, except that the first protective layer and second protective layer were formed so as to contain 10 mol % TiC (Example 3, Sample 1), 10 mol % TaC (Example 3, Sample 2), or 10 mol % $Nb_2C$ (Example 3, Sample 3) in place of the SiC.

EXAMPLE 4

Phase-change optical recording media were produced (Example 4, Samples 1 to 3) in the same manner as in Example 3, except that $Al_2O_3$ was used in place of the $Ta_2O_5$ in the first protective layer and second protective layer.

EXAMPLE 5

A phase-change optical recording medium was produced in the same manner as in Example 1, except that a film consisting of $Ta_2O_5$ and 10 mol % SiC was formed as the first protective layer and a film comprising ZnS and 20 mol % $SiO_2$ was formed as the second protective layer.

EXAMPLE 6

A phase-change optical recording medium was produced in the same manner as in Example 1, except that a film comprising ZnS and 20 mol % $SiO_2$ was formed as the first protective layer and a film comprising $Ta_2O_5$ and 10 mol % SiC was formed as the second protective layer.

EXAMPLE 7

The same procedure as in Example 1 was conducted, except that the sequence of film formation on the substrate was changed so that the reflective layer (thickness: 150 nm), the first protective layer (thickness: 20 nm), the recording layer (thickness: 20 nm), and the second protective layer (thickness: 100 nm) were formed in this order and the protective coating layer having a thickness of 0.1 mm was formed thereon. Thus, a surface reproduction type phase-change optical recording medium having a reversed layer constitution was produced.

COMPARATIVE EXAMPLE 3

A phase-change optical recording medium having the structure shown in FIG. 3 was produced in the following manner.

On a disk-form polycarbonate substrate 31 having a 0.7 µm-wide groove formed with a pitch of 1.4 µm was deposited a first protective layer 32 comprising ZnS and $SiO_2$ (film thickness: 100 nm) by RF sputtering using a ZnS—$SiO_2$ (20 mol %) target. Thereafter, a recording layer 33 comprising $Ge_2Sb_2Te_5$ (film thickness: 20 nm) was deposited thereon by DC sputtering using a $Ge_2Sb_2Te_5$ alloy target. Furthermore, a film comprising ZnS and $SiO_2$ (film thickness: 20 nm) was deposited thereon as a second protective layer 34 by RF sputtering using a ZnS—$SiO_2$ (20mol %)target. Thereafter, an Al—Cr alloy (chromium content: 3 wt %) film (thickness: 150 nm) was formed as a reflective layer 35. An ultraviolet-curable resin was applied thereto to form a protective coating layer 36 having a thickness of 10 µm. Thus, a phase-change optical recording medium was completed.

The phase-change optical recording media obtained in Examples 1 to 6 and Comparative Examples 1 to 3 were subjected to initial crystallization of the recording layer with an initialization apparatus.

Figure 4:
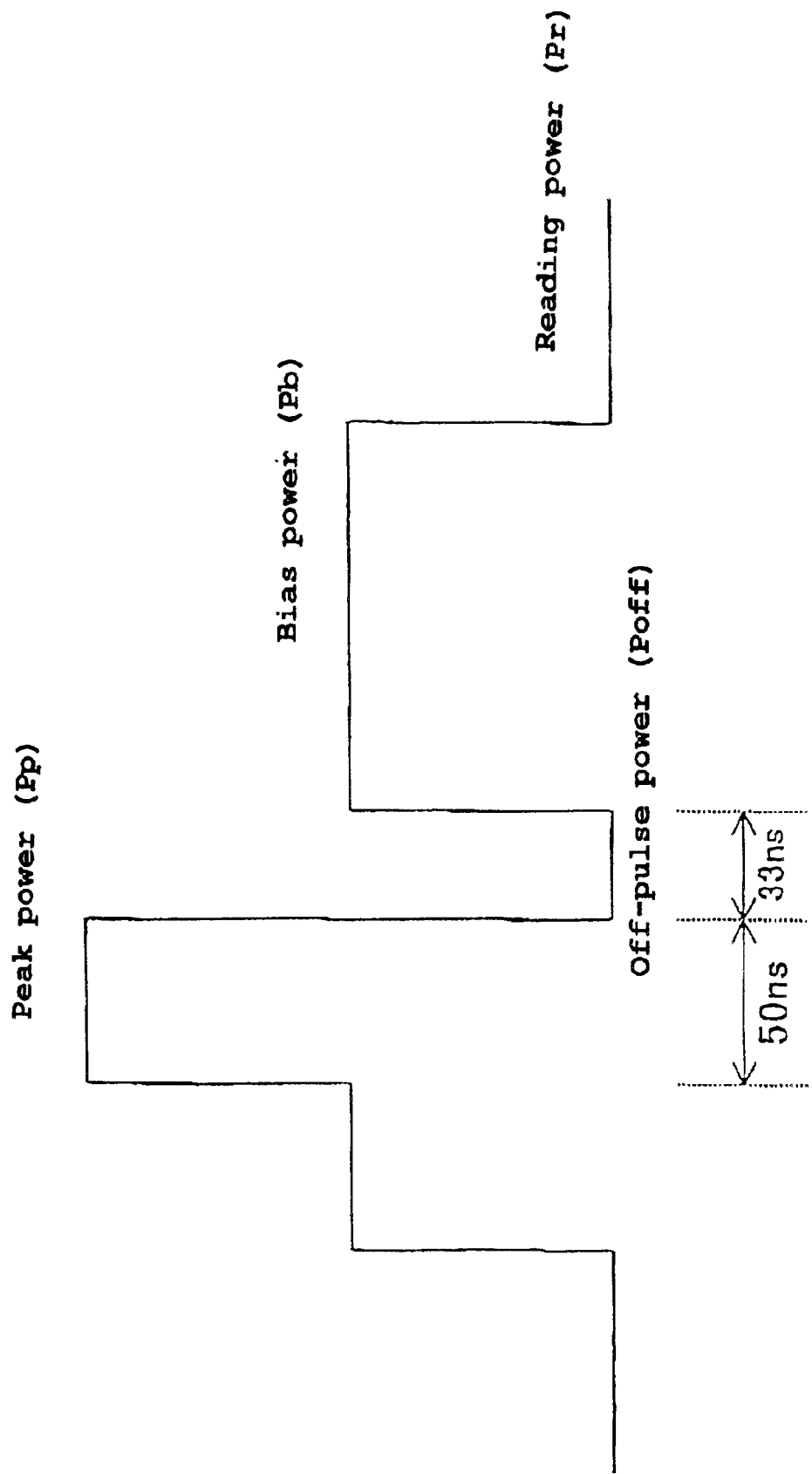
FIG. 4 is an illustration showing a laser power pattern used for recording 0.6 μm marks.

Subsequently, amorphous marks having a length of 0.6 µm were recorded at a linear velocity of 6 m/sec on tracks in the region where the recording layer had been crystallized (recording pitch, 1.2 µm; laser light wavelength, 680 nm; objective lens NA, 0.55). For this recording, a modulated laser power pattern shown in FIG. 4 was used, which additionally had an off-pulse and in which the off-pulse power (Poff) and reproducing power (Pr) each were 1 mW and the peak power duration and off-pulse duration were 50 ns and 33 ns, respectively. Amorphous marks were recorded at a bottom power (Pb) of 5 mW and at various peak powers (Pp). The Pp which resulted in the maximum value of CNR is referred to as optimum Pp ($Pp_0$). Subsequently, amorphous marks were recorded at Pb=5 mW and Pp=$Pp_0$, and the amorphous marks were erased by irradiation with laser beams having various powers. In this operation, the change in carrier level through the erasure was measured and taken as the erasability. The laser power which resulted in the maximum value of the erasability is referred to as optimum Pb ($Pb_0$). Subsequently, amorphous marks (mark length, 0.6 µm) were recorded at a Pp of ($Pp_0$-1) mW and a Pb of ($Pb_0$-1) mW and then erased with a laser of ($Pb_0$-1) mW. This recording/erasure operation was conducted 20 times per track (hereinafter, this step is referred to as initialization).

Amorphous marks having a length of 0.6 µm were recorded on the initialized tracks at a linear velocity of 6 m/sec under the laser power conditions of Pr=1 mW, Poff=1 mW, Pp=$Pp_0$, and Pb=$Pb_0$ (recording pitch, 1.2 µm). These recording marks were erased at various linear velocities and various laser powers. The change in carrier level through the erasure was measured and taken as the erasability.

Figure 5:
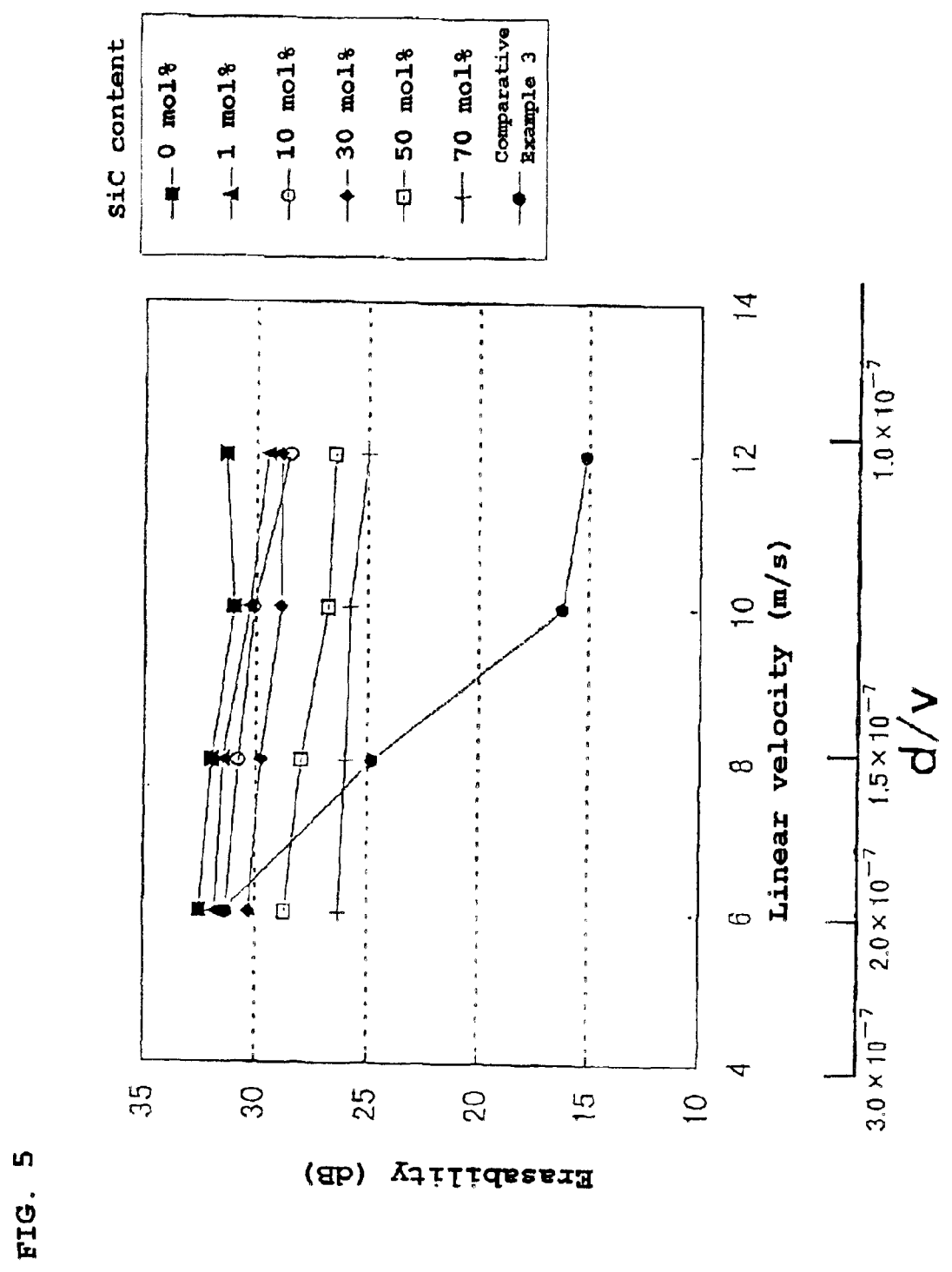

FIG. 5 shows the linear-velocity dependence of the erasability of samples of Example 1 and Comparative Example 1 which had various protective-layer compositions and of the sample of Comparative Example 3. The proportion of $Ta_2O_5$ to SiC in each protective layer was determined by forming a protective layer under the same film deposition conditions and analyzing this layer by fluorescent X-ray spectroscopy. FIG. 5 shows that the protective layers according to the invention brought about higher degrees of erasure than the protective layers of the Comparative Examples in a high linear velocity region (the region where $d/v<1.5\times10^{-7}$ [s], wherein d is the laser beam diameter ($d=\lambda/NA$) and v is the linear velocity).

Figure 6:
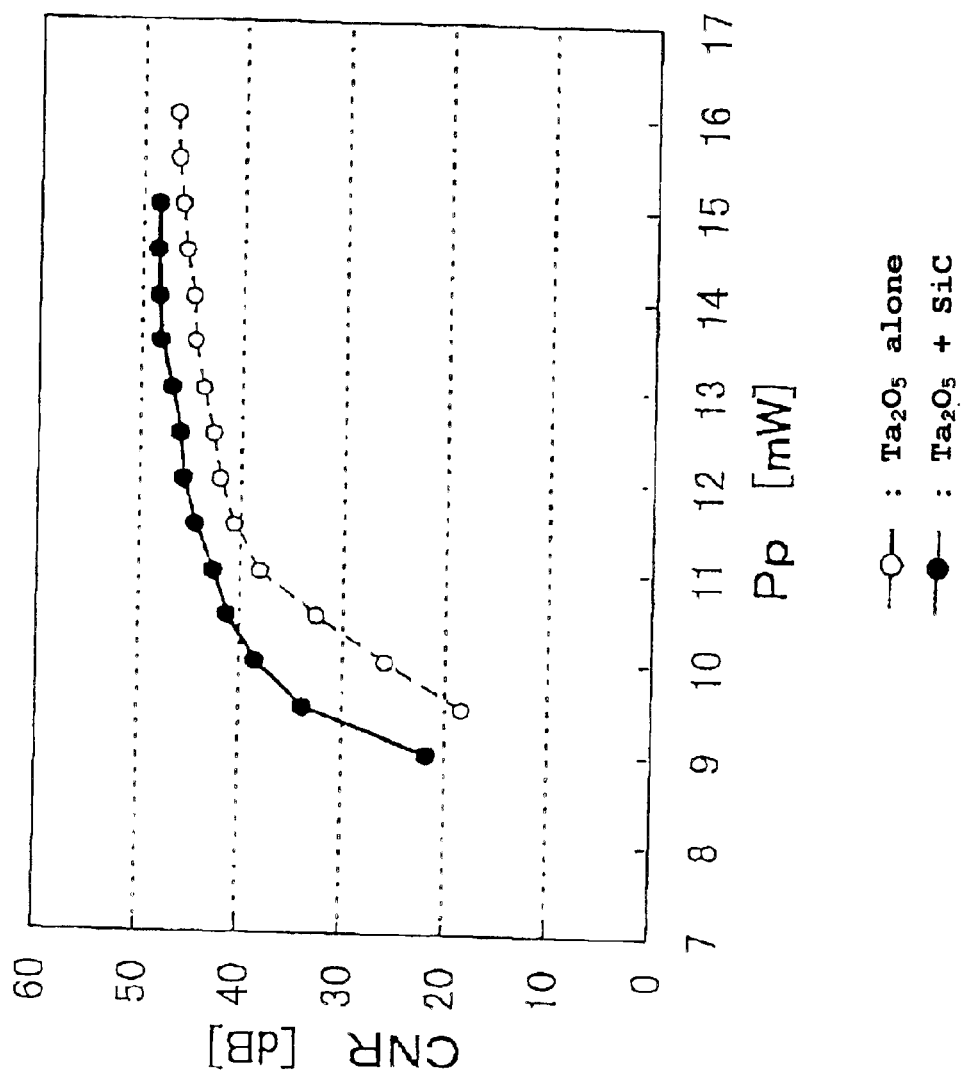
FIG. 6 is a graphic presentation showing the peak power dependence of CNR of a sample of Example 1.

In FIG. 6 are shown the peak power dependence of CNR (hereinafter referred to as "power curve") of the sample having protective layers consisting only of $Ta_2O_5$ (Comparative Example 1, Sample 1) and that of the sample having protective layers comprising $Ta_2O_5$ containing 10 mol % SiC (Example 1, Sample 3). The intersection where each power curve in FIG. 6 crosses the straight line of CNR=30 dB is defined as recording sensitivity (Pth).

The results of measurements of the erasability and Pth of the samples of Examples 1 to 4 and Comparative Examples 1 and 2 are shown in Tables 1 to 4. Furthermore, the results of measurements of the erasability (8 m/s) of the samples of Examples 5 and 6 and Comparative Example 3 are shown in Table 5. With respect to the erasability, values of 25 dB or higher are satisfactory in practical use and values of 28 dB or higher are more preferred. When the SiC content was in the range of from 1 to 40%, a satisfactory balance between the erasability and recording sensitivity was obtained. An excellent balance between these properties was obtained when that content was in the range of from 10 to 30%. SiC contents of 50% and higher tended to result in lowered recording sensitivity.

The same samples were further subjected to an overwriting (OW) cycle test in which recording of amorphous marks having a length of 0.6 μm (recording pitch, 1.2 μm) and recording of amorphous marks having a length of 1.6 μm (recording pitch, 3.2 μm) were alternately conducted (i.e., overwriting was conducted) under the laser power conditions of Pr=1 mW, Poff=1 mW, Pp=Pp$_0$, and Pb=Pb$_0$. As a result, the samples of Examples 1 to 6 were ascertained to have higher cycling durability than the samples of Comparative Examples 1 and 2.

Furthermore, the same samples were subjected to an accelerated weathering test in which the samples were stored in an atmosphere of 85° C. and 95% RH for 250 hours. As a result, the samples of Examples 1 to 6 were ascertained to have higher weatherability than the samples of Comparative Examples 1 and 2.

The sample of Example 7 was subjected to a recording/reproducing test. As a result, a satisfactory CNR and a satisfactory erasability were obtained and the sample was ascertained to be usable as a surface reproduction type optical recording medium.

EXAMPLE 8 AND COMPARATIVE EXAMPLE 4

Phase-change optical recording media having the structure shown in FIG. 3 were produced in the following manner.

On a disk-form polycarbonate substrate 31 having a 0.7 μm-wide groove formed with a pitch of 1.4 μm was deposited a first protective layer 32 comprising $Ta_2O_5$, SiC, and $SiO_2$ (film thickness: 100 nm) by RF sputtering using a $Ta_2O_5$ target and SiC material and $SiO_2$ material pieces placed thereon. Thereafter, a recording layer 33 comprising $Ge_2Sb_2Te_5$ (film thickness: 20 nm) was deposited thereon by DC sputtering using a $Ge_2Sb_2Te_5$ alloy target. Furthermore, a second protective layer 34 consisting of $Ta_2O_5$, SiC, and $SiO_2$ (film thickness: 20 nm) was deposited thereon by RF sputtering using a $Ta_2O_5$ target and SiC material and $SiO_2$ material pieces placed thereon. Thereafter, an Al—Cr alloy (chromium content: 3 wt %) film (thickness: 100 nm) was formed as a reflective layer 35. An ultraviolet-curable resin was applied thereto to form a protective coating layer 36 having a thickness of 10 μm. Thus, a phase-change optical recording medium was completed.

In forming the protective layers in the structure described above, the numbers of SiC material pieces and $SiO_2$ material pieces placed on the $Ta_2O_5$ target were varied. Thus, phase-change optical recording media were obtained in which the protective layers had various compositions (Example 8, Samples 1 to 8). For the purpose of comparison, a phase-change optical recording medium having protective layers having an SiC content of 50 mol % and an $SiO_2$ content of 10 mol % was also produced (Comparative Example 4).

EXAMPLE 9

Phase-change optical recording media were produced in the same manner as in Example 8, except that the first protective layer and second protective layer were formed so as to contain 10 mol % $ZrO_2$ (Example 9, Sample 1), 10 mol % $TiO_2$ (Example 9, Sample 2), 10 mol % $HfO_2$ (Example 9, Sample 3), or 10 mol % $In_2O_3$ (Example 9, Sample 4) in place of the $SiO_2$ and to have an SiC content of 30 mol %.

EXAMPLE 10 AND COMPARATIVE EXAMPLE 5

Phase-change optical recording media were produced (Example 10, Samples 1 to 8) in the same manner as in Example 8, except that $Al_2O_3$ was used in place of the $Ta_2O_5$ in the first protective layer and second protective layer. For the purpose of comparison, a phase-change optical recording medium having protective layers having an SiC content of 50 mol % and an $SiO_2$ content of 10 mol % was also produced (Comparative Example 5).

EXAMPLE 11

Phase-change optical recording media were produced (Example 11, Samples 1 to 4) in the same manner as in Example 9, except that $Al_2O_3$ was used in place of the $Ta_2O_5$ in the first protective layer and second protective layer.

EXAMPLE 12

Phase-change optical recording media were produced in the same manner as in Example 1, except that the recording layer was constituted of $Ge_1Sb_2Te_4$ (Example 12, Sample 1) or $Ge_1Sb_4Te_7$ (Example 12, Sample 2) in place of $Ge_2Sb_2Te_5$, and that the protective layers were formed so as to have an SiC content of 10 mol %.

EXAMPLE 13

A phase-change optical recording medium was produced in the same manner as in Example 1, except that the recording layer was constituted of an Ag—In—Sb—Te alloy (Ag, 4 atomic %; In, 6 atomic %; Sb, 61 atomic %; Te, 29 atomic %) in place of $Ge_2Sb_2Te_5$, and that the protective layers were formed so as to have an SiC content of 10 mol %.

The phase-change optical recording media obtained in Examples 8 to 13 and Comparative Examples 4 and 5 were subjected to initial crystallization of the recording layer with an initialization apparatus.

Subsequently, amorphous marks having a length of 0.6 μm were recorded at a linear velocity of 6 m/sec on tracks in the region where the recording layer had been crystallized (recording pitch, 1.2 μm; laser light wavelength, 680 nm; objective lens NA, 0.55). For this recording, a modulated laser power pattern shown in FIG. 4 was used, which additionally had an off-pulse and in which the off-pulse power (Poff) and reproducing power (Pr) each were 1 mW and the peak power duration and off-pulse duration were 50 ns and 33 ns, respectively. Amorphous marks were recorded at a bias power (Pb) of 5 mW and at various peak powers (Pp). The Pp which resulted in the maximum value of CNR is referred to as optimum Pp ($Pp_O$) Subsequently, amorphous marks were recorded at Pb=5 mW and Pp=$Pp_O$, and the amorphous marks were erased by irradiation with laser beams having various powers. In this operation, the change in carrier level through the erasure was measured and taken as the erasability. The laser power which resulted in the maximum value of the erasability is referred to as optimum Pb ($Pb_O$). Subsequently, amorphous marks (mark length, 0.6 μm) were recorded at a Pp of ($Pp_O$–1) mW and a Pb of ($Pb_O$–1) mW and then erased with a laser of ($Pb_O$–1) mW. This recording/erasion operation was conducted 20 times per track.

Amorphous marks (mark length, 0.6 μm) were recorded on the initialized tracks at Pb=$Pb_O$ mW and a linear velocity of 6 m/sec to examine the recording power (Pp) dependence of CNR. Furthermore, amorphous marks having a length of 0.6 μm were recorded on the initialized tracks at a linear velocity of 6 m/sec under the laser power conditions of Pr=1 mW, Poff=1 mW, Pp=$Pp_O$, and Pb=$Pb_O$ (recording pitch, 1.2 μm). These recording marks were erased at various linear velocities and various laser powers. The change in carrier level through the erasion was measured and taken as the erasability.

The results of examination of the erasability and Pth of the samples of Examples 8 to 11 are shown in Tables 6 to 9, respectively. For the purpose of comparison, the results of examination of some of the samples of Example 1 and Comparative Examples 1 and 4 and the results of the examination of some of the samples of Example 2 and Comparative Examples 2 and 5 are also shown in Tables 6 and 8, respectively. Furthermore, the results of examination of the erasability of the samples of Examples 12 and 13 as obtained at a linear velocity of 12 m/s are shown in Table 10. For the purpose of comparison, the results of examination of Sample 3 of Example 1 and the sample of Comparative Example 3 are also shown in Table 10. These Tables show that the effect of improving recording sensitivity was enhanced by adding an oxide of silicon, zirconium, titanium, hafnium, or indium. The Tables further show that the Ge—Sb—Te recording layers attained higher erasabilty than the Ag—In—Sb—Te recording layer.

The samples of Examples 8 to 11 were further subjected to a direct overwriting (DOW) cycle test in which amorphous marks having a length of 0.6 μm were recorded (recording pitch, 1.2 μm) under the laser power conditions of Pr=1 mW, Poff=1 mW, Pp=$Pp_O$, and Pb=$Pb_O$. As a result, these samples were ascertained to have higher cycling durability than the samples of Comparative Examples 1 and 2.

Furthermore, the samples of Examples 8 to 11 were subjected to an accelerated weathering test in which the samples were stored in an atmosphere of 85° C. and 95% RH for 250 hours. As a result, these samples were ascertained to have higher weatherability than the samples of Comparative Examples 1 and 2.

According to the invention, phase-change optical recording media can be obtained which are effective in attaining diminution in unerased signals and an improvement in the erasability in overwriting at a high linear velocity and which have high recording sensitivity, satisfactory OW cycling characteristics, and satisfactory weatherability. Consequently, phase-change optical disks capable of high-rate data transfer and having high durability can be produced according to the invention.

TABLE 1

| Sample | SiC content [mol %] | Erasability [dB] | Pth [mW] |
|---|---|---|---|
| Comparative Example 1-1 | 0 | 31.4 | 10.3 |
| Example 1-1 | 1 | 29.5 | 9.8 |
| Example 1-2 | 5 | 29.0 | 9.7 |
| Example 1-3 | 10 | 28.5 | 9.3 |
| Example 1-4 | 30 | 28.9 | 8.5 |
| Example 1-5 | 35 | 28.5 | 8.7 |
| Example 1-6 | 40 | 28.0 | 8.9 |
| Comparative Example 1-2 | 50 | 26.5 | 9.9 |
| Comparative Example 1-3 | 70 | 25.0 | 10.3 |

TABLE 2

| Sample | SiC content [mol %] | Erasability [dB] | Pth [mW] |
|---|---|---|---|
| Comparative Example 2-1 | 0 | 31.4 | 11.5 |
| Example 2-1 | 1 | 29.7 | 9.9 |
| Example 2-2 | 5 | 29.5 | 9.6 |
| Example 2-3 | 10 | 28.7 | 9.4 |
| Example 2-4 | 30 | 28.3 | 8.9 |
| Example 2-5 | 35 | 28.0 | 9.0 |
| Example 2-6 | 40 | 27.8 | 9.1 |
| Comparative Example 2-2 | 50 | 26.0 | 9.9 |
| Comparative Example 2-3 | 70 | 24.5 | 11.0 |

TABLE 3

| Sample | Carbide | Erasability [dB] | Pth [mW] |
|---|---|---|---|
| Example 3-1 | TiC | 28.3 | 9.2 |
| Example 3-2 | TaC | 27.8 | 9.5 |
| Example 3-3 | $Nb_2C$ | 28.0 | 9.3 |

TABLE 4

| Sample | Carbide | Erasability [dB] | Pth [mW] |
|---|---|---|---|
| Example 4-1 | TiC | 28.5 | 9.5 |
| Example 4-2 | TaC | 28.3 | 9.7 |
| Example 4-3 | $Nb_2C$ | 28.2 | 9.6 |

TABLE 5

| Sample | First protective layer | Second protective layer | Maximum erasabiulity [dB] |
|---|---|---|---|
| Example 5 | $Ta_2O_5$ + SiC | ZnS – $SiO_2$ | 33 |
| Example 6 | ZnS – $SiO_2$ | $Ta_2O_5$ + SiC | 36 |
| Comparative Example 3 | ZnS – $SiO_2$ | ZnS – $SiO_2$ | 25 |

(linear velocity: 8 m/s)

TABLE 6

| Sample | SiC [mol %] | SiO$_2$ [mol %] | Erasability [dB] | Pth [mW] |
|---|---|---|---|---|
| Comparative Example 1 | 0 | 0 | 31.4 | 10.3 |
| Example 1-1 | 1 | 0 | 29.5 | 9.8 |
| Example 1-2 | 5 | 0 | 29.0 | 9.7 |
| Example 1-3 | 10 | 0 | 28.5 | 9.3 |
| Example 8-1 | 10 | 5 | 28.5 | 9.1 |
| Example 8-2 | 10 | 10 | 28.3 | 8.7 |
| Example 8-3 | 10 | 20 | 28.2 | 8.3 |
| Example 8-4 | 10 | 30 | 28.2 | 8.0 |
| Example 8-5 | 10 | 40 | 28.0 | 7.5 |
| Example 8-6 | 20 | 10 | 28.5 | 8.4 |
| Example 8-7 | 30 | 10 | 28.6 | 8.5 |
| Example 8-8 | 40 | 10 | 27.8 | 8.8 |
| Comparative Example 4 | 50 | 10 | 26.2 | 9.7 |

TABLE 7

| Sample | Oxide | Erasability [dB] | Pth [mW] |
|---|---|---|---|
| Example 9-1 | ZrO$_2$ | 28.4 | 8.1 |
| Example 9-2 | TiO$_2$ | 27.8 | 8.0 |
| Example 9-3 | HfO$_2$ | 28.0 | 7.8 |
| Example 9-4 | In$_2$O$_3$ | 28.2 | 7.8 |

TABLE 8

| Sample | SiC [mol %] | SiO$_2$ [mol %] | Erasability [dB] | Pth [mW] |
|---|---|---|---|---|
| Comparative Example 2 | 0 | 0 | 31.4 | 11.5 |
| Example 2-1 | 1 | 0 | 29.7 | 9.9 |
| Example 2-2 | 5 | 0 | 29.5 | 9.6 |
| Example 2-3 | 10 | 0 | 28.7 | 9.4 |
| Example 10-1 | 10 | 5 | 28.4 | 9.1 |
| Example 10-2 | 10 | 10 | 28.2 | 8.8 |
| Example 10-3 | 10 | 20 | 28.0 | 8.4 |
| Example 10-4 | 10 | 30 | 28.0 | 8.0 |
| Example 10-5 | 10 | 40 | 27.5 | 7.5 |
| Example 10-6 | 20 | 10 | 28.0 | 8.5 |
| Example 10-7 | 30 | 10 | 28.0 | 8.7 |
| Example 10-8 | 40 | 10 | 27.5 | 9.0 |
| Comparative Example 5 | 50 | 10 | 26.0 | 9.9 |

TABLE 9

| Sample | Oxide | Erasability [dB] | Pth [mW] |
|---|---|---|---|
| Example 11-1 | ZrO$_2$ | 28.2 | 8.3 |
| Example 11-2 | TiO$_2$ | 27.6 | 8.2 |
| Example 11-3 | HfO$_2$ | 27.8 | 8.0 |
| Example 11-4 | In$_2$O$_3$ | 28.0 | 7.9 |

TABLE 10

| Sample | Protective layer | Recording layer | Erasability [dB] |
|---|---|---|---|
| Example 1-3 | Ta$_2$O$_5$ + SiC | Ge$_2$Sb$_2$Te$_5$ | 28.5 |
| Example 12-1 | Ta$_2$O$_5$ + SiC | Ge$_1$Sb$_2$Te$_4$ | 29.1 |
| Example 12-2 | Ta$_2$O$_5$ + SiC | Ge$_1$Sb$_4$Te$_7$ | 28.8 |
| Example 13 | Ta$_2$O$_5$ + SiC | AgInTeSb | 21.2 |

TABLE 10-continued

| Sample | Protective layer | Recording layer | Erasability [dB] |
|---|---|---|---|
| Comparative Example 3 | ZnS – SiO$_2$ | Ge$_2$Sb$_2$Te$_5$ | 15.1 |

(12 m/s)

What is claimed is:

1. A phase-change optical recording medium which comprises a substrate and formed thereon a multilayered film comprising a protective layer and a recording layer and in which information is recorded/erased based on reversible phase changes in the recording layer between a crystalline phase and an amorphous phase, wherein the protective layer comprises an oxide of tantalum and at least one carbide, the content of the carbide in the protective layer is from 1 to 40 mol %, and the protective layer is in contact with the recording layer.

2. The phase-change optical recording medium of claim 1, wherein the protective layer contains one or more carbides selected from the group consisting of carbides of silicon, titanium, tantalum, and niobium.

3. The phase-change optical recording medium of claim 2, wherein the recording layer comprises an alloy of germanium, antimony and tellurium, or a material containing the alloy as the main component.

4. The phase-change optical recording medium of claim 3, which is used under the conditions of $d/v < 1.5 \times 10^{-7}$, wherein d is the laser beam diameter as measured on the recording layer ($d=\lambda/NA$, wherein $\lambda$ is the wavelength of the laser light and NA is the numerical aperture of the objective lens) and v is the linear velocity.

5. A phase-change optical recording medium which comprises a substrate and formed thereon a multilayered film comprising a protective layer and a recording layer and in which information is recorded/erased based on reversible phase changes in the recording layer between a crystalline phase and an amorohous phase, wherein the protective layer comprises an oxide of aluminum and at least one carbide, the content of the carbide in the protective layer is from 1 to 40 mol %. and the protective layer is in contact with the recording layer, wherein
  the protective layer contains one or more carbides selected from the group consisting of carbides of silicon, titanium, tantalum, and niobium, and
  the recording layer comprises an alloy of germanium, antimony and tellurium, or a material containing the alloy as the main component.

6. The phase-change optical recording medium of claim 5, which is used under the conditions of $d/v < 1.5 \times 10^{-7}$, wherein d is the laser beam diameter as measured on the recording layer ($d=\lambda/NA$, wherein $\lambda$ is the wavelength of the laser light and NA is the numerical aperture of the objective lens) and v is the linear velocity.

7. A phase-change optical recording medium which comprises a substrate and formed thereon a multilayered film comprising a protective layer and a recording layer and in which information is recorded/erased based on reversible phase changes in the recording layer between a crystalline phase and an amorphous phase, wherein the protective layer comprises an oxide of tantalum, at least one carbide, and one or more oxides of one or more elements selected from the group consisting of indium, silicon, titanium, hafnium, and zirconium, the content of the carbide in the protective layer is from 1 to 40 mol %, and the protective layer is in contact with the recording layer.

8. The phase-change optical recording medium of claim 7, wherein the protective layer contains one or more carbides selected from the group consisting of carbides of silicon, titanium, tantalum, and niobium.

9. The phase-change optical recording medium of claim 8, wherein the recording layer comprises an alloy of germanium, antimony and tellurium, or a material containing the alloy as the main component.

10. The phase-change optical recording medium of claim 9, which is used under the conditions of $d/v<1.5\times10^{-7}$, wherein d is the laser beam diameter as measured on the recording layer ($d=\lambda/NA$, wherein $\lambda$ is the wavelength of the laser light and NA is the numerical aperture of the objective lens) and v is the linear velocity.

11. A phase-change optical recording medium which comprises a substrate and formed thereon a multilayered film comprising a protective layer and a recording layer and in which information is recorded/erased based on reversible phase changes in the recording layer between a crystalline phase and an amorphous phase, wherein the protective layer comprises an oxide of aluminum, at least one carbide, and one or more oxides of one or more elements selected from the group consisting of indium, silicon, titanium, hafnium, and zirconium, the content of the carbide in the protective layer is from 1 to 40 mol %, and the protective layer is in contact with the recording layer, wherein the protective layer contains one or more carbides selected from the group consisting of carbides of silicon, titanium, tantalum, and niobium, and the recording layer comprises an alloy of germanium, antimony and tellurium, or a material containing the alloy as the main component.

12. The phase-change optical recording medium of claim 11, which is used under the conditions of $d/v<1.5\times10^{-7}$, wherein d is the laser beam diameter as measured on the recording layer ($d=\lambda/NA$, wherein $\lambda$ is the wavelength of the laser light and NA is the numerical aperture of the objective lens) and v is the linear velocity.

* * * * *